US009824647B2

(12) United States Patent
Shin et al.

(10) Patent No.: US 9,824,647 B2
(45) Date of Patent: Nov. 21, 2017

(54) DISPLAY APPARATUS AND METHOD OF CONTROLLING THE SAME

(71) Applicant: Samsung Display Co., Ltd., Yongin-si, Gyeonggi-Do (KR)

(72) Inventors: Ho-Sik Shin, Gunpo-si (KR); Junghyun Kim, Seoul (KR); Yong-hoon Kwon, Hwaseong-si (KR); Hee-kwang Song, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 27 days.

(21) Appl. No.: 14/796,236

(22) Filed: Jul. 10, 2015

(65) Prior Publication Data

US 2016/0217752 A1 Jul. 28, 2016

(30) Foreign Application Priority Data

Jan. 26, 2015 (KR) ........................ 10-2015-0012294

(51) Int. Cl.

| | |
|---|---|
| ***G06T 7/00*** | (2017.01) |
| ***G02B 7/36*** | (2006.01) |
| ***G06K 9/46*** | (2006.01) |
| ***G02F 1/133*** | (2006.01) |
| ***G09G 3/34*** | (2006.01) |
| ***G09G 3/36*** | (2006.01) |
| ***G06T 9/00*** | (2006.01) |
| ***H01L 27/146*** | (2006.01) |
| ***H04N 9/04*** | (2006.01) |

(52) U.S. Cl.
CPC ......... *G09G 3/3607* (2013.01); *G09G 3/3426* (2013.01); *G09G 2300/0452* (2013.01); *G09G 2320/0646* (2013.01)

(58) Field of Classification Search
CPC .............................. G09G 3/342; G09G 3/3426
See application file for complete search history.

(56) References Cited

U.S. PATENT DOCUMENTS

| | | | |
|---|---|---|---|
| 7,609,240 B2 | 10/2009 | Park et al. | |
| 8,350,799 B2 | 1/2013 | Wasinger et al. | |
| 2003/0215129 A1* | 11/2003 | Yang | G06T 7/0002 382/149 |
| 2008/0198180 A1 | 8/2008 | Langendijk | |

(Continued)

FOREIGN PATENT DOCUMENTS

| | | |
|---|---|---|
| JP | 2012-027405 A | 2/2012 |
| KR | 10-2007-0079145 A | 8/2007 |

(Continued)

*Primary Examiner* — Lin Li
(74) *Attorney, Agent, or Firm* — H.C. Park & Associates, PLC

(57) ABSTRACT

A controlling method of a display apparatus, which includes pixels each including red, green, blue, and white sub-pixels, includes receiving image data in a unit of frame, analyzing the image data to extract pixel data with respect to a first pixel among the pixels and block data with respect to a first block of a backlight unit, which corresponds to the first pixel, normalizing the pixel data and the block data, comparing the normalized pixel data and the normalized block data, and generating white compensation data corresponding to the white sub-pixel on the basis of the compared result.

19 Claims, 3 Drawing Sheets

(56) References Cited

U.S. PATENT DOCUMENTS

2009/0121992 A1* 5/2009 Asao ................. G02F 1/133514 345/88
2009/0122087 A1* 5/2009 Maruyama ........... G09G 3/3611 345/690
2009/0174638 A1* 7/2009 Brown Elliott ... G02F 1/133621 345/88
2009/0268053 A1* 10/2009 Wang ................ H01L 27/14625 348/229.1
2010/0007670 A1* 1/2010 Song .................... G09G 3/3426 345/522
2010/0039452 A1* 2/2010 Park ..................... G09G 3/3413 345/690
2011/0199534 A1* 8/2011 Kawai .................... G02B 7/365 348/345
2011/0227957 A1* 9/2011 Jung .................... G09G 3/3426 345/690
2012/0026211 A1 2/2012 Kikuchi et al.
2012/0299979 A1* 11/2012 Murai .................. G09G 3/3426 345/690
2013/0155120 A1* 6/2013 Kang ....................... G09G 5/02 345/690
2013/0265338 A1* 10/2013 Chaji ................... G09G 3/3208 345/690
2013/0342724 A1* 12/2013 Kitajima .................. G06K 9/46 348/223.1
2014/0368554 A1* 12/2014 Asano ....................... G06T 9/00 345/690
2016/0249025 A1* 8/2016 Aruga .................... H04N 9/045

FOREIGN PATENT DOCUMENTS

KR 10-2008-0031947 A 4/2008
KR 10-2009-0088285 A 9/2009
KR 10-2012-0024829 A 3/2012
KR 10-2013-0071227 A 6/2013

* cited by examiner

DISPLAY APPARATUS AND METHOD OF CONTROLLING THE SAME

CLAIM OF PRIORITY

This U.S. non-provisional patent application claims the priority of and all the benefits accruing under 35 U.S.C. §119 of Korean Patent Application No. 10-2015-0012294, filed on Jan. 26, 2015 in the Korean Intellectual Property Office (KIPO), the contents of which are hereby incorporated by reference in its entirety.

BACKGROUND OF THE INVENTION

1. Field of Disclosure

The present disclosure relates to a display apparatus and a method of controlling the same. More particularly, the present disclosure relates to a display apparatus having a backlight unit driven in a color dimming mode and a method of controlling the display apparatus.

2. Description of the Related Art

In recent years, various flat panel displays, such as a liquid crystal display, a plasma display panel, an organic light emitting diode display, etc., are mainly used as image display devices.

The liquid crystal display includes a display panel displaying an image through pixels arranged in a matrix form using optical and electrical properties of liquid crystal molecules, such as anisotropic refractive index and anisotropic dielectric constant, a driving circuit driving the display panel, and a backlight unit providing a light to the display panel. Each pixel of the liquid crystal display displays a grayscale by changing an alignment of the liquid crystal molecules in response to various signals, e.g., a gate signal, a data signal, a common voltage signal, etc., and controlling a light transmittance of the light generating from the backlight unit and passing through the display panel and a polarizing plate.

In the liquid crystal display, each pixel has a brightness determined by multiplying a brightness of the backlight unit by the light transmittance of the liquid crystal molecules. To improve a contrast ratio and reduce power consumption, the liquid crystal display uses a backlight dimming method that analyzes input image data and controls a dimming value to control the brightness of the backlight unit and to compensate for the data.

In recent, a light emitting diode (hereinafter, referred to as an LED) backlight unit employing LEDs is widely used as a light source of the backlight unit since the LED has advantages of high brightness and low power consumption when compared to a cold cathode fluorescent lamp.

The LED backlight unit is driven in a local dimming method that controls the brightness of specific block of the LED backlight unit after dividing a light emitting area of the light source of the LED backlight unit into plural blocks. The local dimming method divides the light emitting area of the LED backlight unit into the blocks, analyzes the data in accordance with the blocks, determines a local dimming value, and compensates for the data, and thus the contrast ratio is improved and the power consumption is reduced.

The LED backlight unit mainly uses a white LED emitting a white light, but an LED backlight unit emitting colored light includes at least two LEDs displaying different light colors of primary colors, i.e., red (R), green (G), and blue (B) color LEDs, to improve color reproducibility. The liquid crystal display employing the color LED backlight unit is operated in a color dimming method that individually analyzes R, G, and B image data and controls R, G, and B LEDs in each block, thereby reducing the power consumption and improving the color reproducibility.

In a case that the backlight unit, which is driven in the color dimming method, provides the light to pixels each including red (R), green (G), blue (B), and white (W) sub-pixels, the color reproducibility of each pixel is lowered. This is because a color filter for the white sub-pixel does not exist and the light provided to the white sub-pixel from the backlight unit is not sharpened. That is, a full-width-half-maximum (FWHM) of the light becomes wider and the light provided to the white sub-pixel exerts influence on other sub-pixels.

Accordingly, a control method of a display apparatus preventing deterioration of the color reproducibility, which is caused by applying the backlight unit driven in the color dimming method to a pixel having a pentile structure, is required.

SUMMARY OF THE INVENTION

The present disclosure provides a display apparatus capable of preventing a color reproducibility of a display panel from being deteriorated due to a color dimming driving method of a backlight unit.

The present disclosure provides a method of controlling the display apparatus.

Embodiments of the inventive concept provide a controlling method of a display apparatus, which includes a plurality of pixels each including red, green, blue, and white sub-pixels, including receiving image data in a unit of frame, analyzing the image data to extract pixel data with respect to a first pixel among the pixels and block data with respect to a first block of a backlight unit, which corresponds to the first pixel, normalizing the pixel data and the block data, comparing the normalized pixel data and the normalized block data, and generating white compensation data corresponding to the white sub-pixel on the basis of the compared result.

The pixel data include red pixel data, green pixel data, and blue pixel data, which respectively correspond to the red, green, and blue sub-pixels.

The red pixel data are about a grayscale of the red sub-pixel, the green pixel data are about a grayscale of the green sub-pixel, and the blue pixel data are about a grayscale of the blue sub-pixel.

The first block includes a red light source having a red light color, a green light source having a green light color, and a blue light source having a blue light color.

A red light emitted from the red light source has a wavelength of about 580 nm to about 700 nm, a green light emitted from the green light source has a wavelength of about 460 nm to about 630 nm, and a blue light emitted from the blue light source has a wavelength of about 400 nm to about 520 nm.

The block data include red block data, green block data, and blue block data, which respectively correspond to the red, green, and blue light sources.

The red block data are about a dimming level of the red light source, the green block data are about a dimming level of the green light source, and the blue block data are about a dimming level of the blue light source.

The normalizing of the pixel data includes selecting one of the red, green, and blue pixel data as reference pixel data, normalizing the other pixel data using the reference pixel data except for the selected reference pixel data, and generating first and second normalized pixel data.

The normalizing of the block data includes selecting one of the red, green, and blue block data as reference block data, normalizing the other block data using the reference block data except for the selected reference block data, and generating first and second normalized block data.

The comparing of the normalized pixel data and the normalized block data includes comparing the first normalized pixel data and the first normalized block data and comparing the second normalized pixel data and the second normalized block data.

The first normalized pixel data and the first normalized block data have same color properties and the second normalized pixel data and the second normalized block data have same color properties.

The comparing of the first and second normalized pixel data to the first and second normalized block data, respectively, includes calculating the first normalized pixel data and the first normalized block data to generate first intermediate data corresponding to a difference between the first normalized pixel data and the first normalized block data and calculating the second normalized pixel data and the second normalized block data to generate second intermediate data corresponding to a difference between the second normalized pixel data and the second normalized block data.

The white compensation data are generated by using the first intermediate data, the second intermediate data, and a previously stored white pixel data.

The previously stored white pixel data are data about a maximum grayscale of the white sub-pixel.

The white compensation data are decreased as the first and second intermediate data becomes greater.

The generating of the white compensation data includes applying the first intermediate data, the second intermediate data, and the previously stored white pixel data to the following equation of $W'=W\cdot\{1-[K\cdot(\Delta X+\Delta Y)]\}$, where W' denotes the white compensation data, W denotes the previously white pixel data, $\Delta X$ denotes the first intermediate data, $\Delta Y$ denotes the second intermediate data, and K denotes a color control constant, to generate the white compensation data.

The method further includes processing the pixel data to correspond to layouts of the sub-pixels included in each of the pixels and to generate compensated pixel data.

The method further includes driving each of the pixels on the basis of the compensated pixel data and the white compensation data.

The method further includes generating an input pulse width modulation signal using the block data and driving the first block in a color dimming mode using the pulse width modulation signal.

Embodiments of the inventive concept provide a display apparatus including a display panel including a plurality of pixels each including red, green, blue, and white sub-pixels, a backlight unit including a plurality of blocks each being driven in a color dimming mode, and a color compensator compensating a color of a light exiting through each of the pixels. The color compensator receives image data in a unit of frame, analyzes the image data to extract pixel data with respect to a first pixel among the pixels and block data with respect to a first block of the backlight unit, which corresponds to the first pixel, normalizes the pixel data and the block data, compares the normalized pixel data and the normalized block data, and generates white compensation data corresponding to the white sub-pixel on the basis of the compared result.

The pixel data include red pixel data, green pixel data, and blue pixel data, which respectively correspond to the red, green, and blue sub-pixels, the red pixel data are about a grayscale of the red sub-pixel, the green pixel data are about a grayscale of the green sub-pixel, and the blue pixel data are about a grayscale of the blue sub-pixel.

The first block includes a red light source having a red light color, a green light source having a green light color, and a blue light source having a blue light color, the block data include red block data, green block data, and blue block data, which respectively correspond to the red, green, and blue light sources, the red block data are about a dimming level of the red light source, the green block data are about a dimming level of the green light source, and the blue block data are about a dimming level of the blue light source.

According to the above, the color reproducibility of the pixels may be prevented from being deteriorated due to the white sub-pixel that does not include the color filter.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
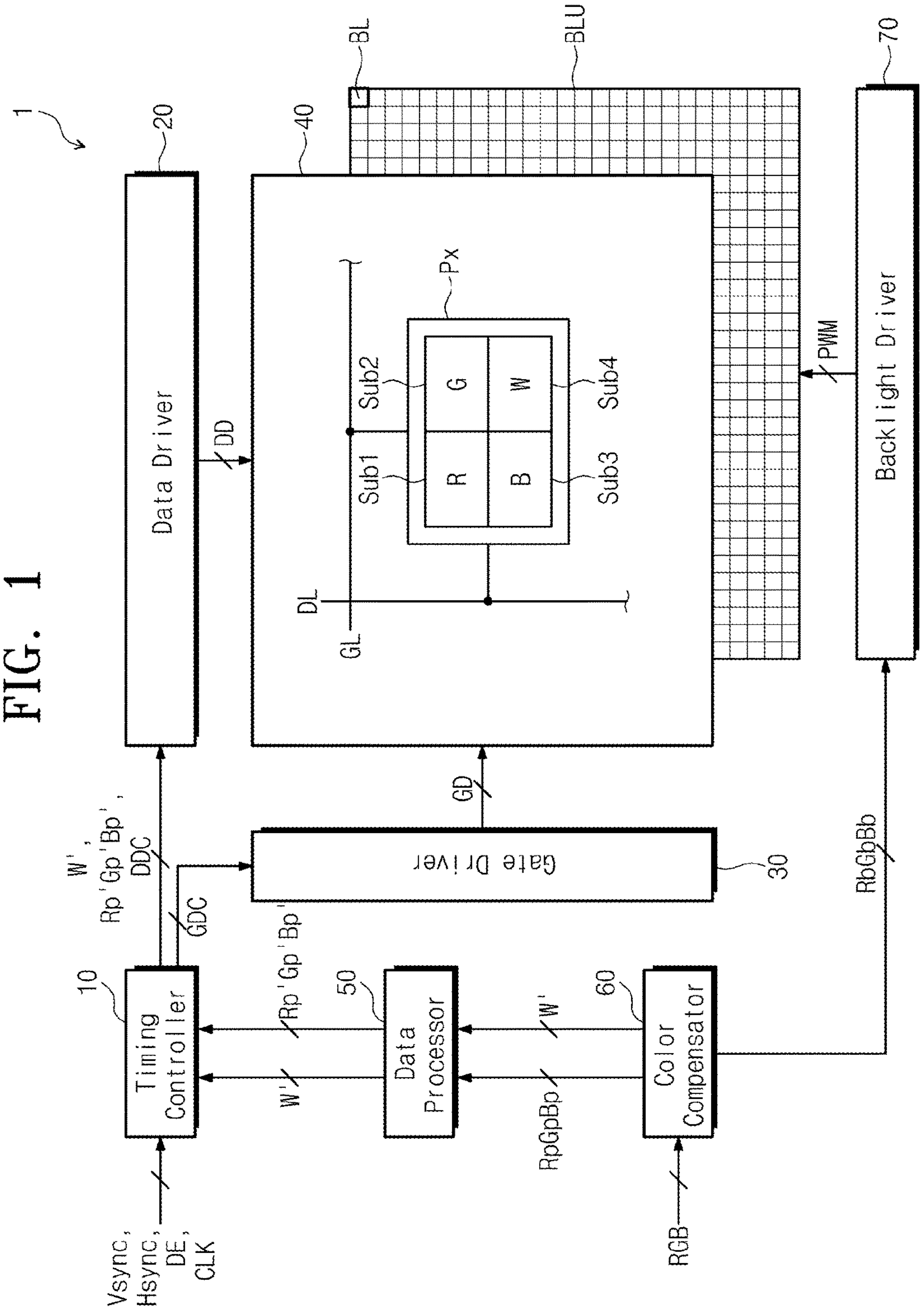
FIG. 1 is a block diagram showing a display apparatus according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a block diagram showing a display apparatus 1 according to an exemplary embodiment of the present disclosure.

Referring to FIG. 1, the display apparatus 1 includes a display panel 40, a timing controller 10, a data driver 20, a gate driver 30, a backlight unit BLU, a backlight driver 70, a data processor 50, and a color compensator 60.

The display panel 40 includes a plurality of pixels PX each being driven by a gate signal GD and a data signal DD, which are applied thereto. In more detail, each pixel PX includes a switching device (not shown) connected to a gate line GL and a data line DL, a liquid crystal capacitor (not shown) connected to the switching device, and a storage capacitor (not shown) connected to the switching device. When the switching device is turned on in response to the gate signal GD provided through the gate line GL, the liquid crystal capacitor controls an alignment of liquid crystal molecules in response to the data signal DD provided through the data line DL, and thus an image corresponding to a desired grayscale is displayed.

Each pixel PX includes a plurality of sub-pixels. For instance, each pixel PX includes red, green, blue, and white sub-pixels Sub1, Sub2, Sub3, and Sub4. The red, green, blue, and white sub-pixels Sub1, Sub2, Sub3, and Sub4 include color filters to covert a light provided from the backlight unit BLU to a light having a specific wavelength. The red, green, and blue sub-pixels Sub1, Sub2, and Sub3 respectively include red, green, and blue color filters.

The white sub-pixel Sub4 does not include the color filter, and thus the white sub-pixel Sub4 transmits the light from the backlight unit BLU without changing the light from the backlight unit BLU. The light transmitting through the white sub-pixel Sub4 exerts an influence on the light transmitting through the red, green, and blue sub-pixels Sub1, Sub2, and Sub3. In particular, the light transmitting through the white sub-pixel Sub4 exerts an influence on a color reproducibility of the pixels PX.

The timing controller 10 receives timing signals, such as a vertical synchronization signal $V_{sync}$, a horizontal synchronization signal $H_{sync}$, a clock signal CLK, a data enable signal DE, etc. The timing controller 10 generates a data driving signal DDC to control an operation timing of the data driver 20 and a gate driving signal GDC to control an operation timing of the gate driver 30 on the basis of the timing signals.

In addition, the timing controller 10 receives compensated pixel data Rp', Gp', and Bp' and white compensation data W' from the data processor 50 described later. The timing controller 10 applies the data driving signal DDC, the compensated pixel data Rp', Gp', and Bp', and the white compensation data W' to the data driver 20 and applies the gate driving signal GDC to the gate driver 30.

Responsive to the data driving signal DDC from the timing controller 10, the data driver 20 generates the data signal DD in an analog form using the compensated pixel data Rp', Gp', and Bp' and the white compensation data W'. The data driver 20 applies the generated data signal DD to the data line DL.

The gate driver 30 generates the gate signal GD in response to the gate driving signal GDC from the timing controller 10 and applies the generated gate signal GD to the gate line GL.

The backlight unit BLU includes red, green, and blue light sources (not shown) and is divided into a plurality of blocks BL. Each block BL includes the red, green, and blue light sources. The red light source is a red LED string having a red light color, the green light source is a green LED string having a green light color, and a blue light source is a blue LED string having a blue light color. A red light emitted from the red light source has a wavelength from about 580 nm to about 700 nm, a green light emitted from the green light source has a wavelength from about 460 nm to about 630 nm, and a blue light emitted from the blue light source has a wavelength from about 400 nm to about 520 nm.

The backlight unit BLU is driven in a color dimming mode with respect to each block BL. For instance, the backlight unit BLU is driven in the color dimming mode since the brightness is controlled in accordance with each block BL and each light source by a pulse width modulation (PWM) signal PWMS provided from the backlight driver 70. The PWMS may include information about a duty ratio of the light sources of each block BL.

The backlight driver 70 receives a block data Rb, Gb, and Bb about a dimming level with respect to each light source of each block BL and generates the PWMS on the basis of the block data Rb, Gb, and Bb. In particular, the backlight driver 70 determines a duty ratio of each light source according to the dimming level of each light source to generate the PWMS. The backlight driver 70 applies the PWMS to the backlight unit BLU to drive the backlight unit BLU in the color diming mode.

The color compensator 60 receives image data R, G, and B in a frame unit. The image data R, G, and B correspond to data in an R, G, and B color space, which include red, green, and blue light colors as a base configuration. The R, G, and B color space combines colors using a principle that the white color is obtained by combining three primary colors, i.e., red, green, and blue colors.

The color compensator 60 analyzes the image data R, G, and B and extracts pixel data Rp, Gp, and Bp and the block data Rb, Gb, and Bb corresponding to the pixel data Rp, Gp, and Bp. The color compensator 60 generates the white compensation data W' related to a grayscale of the white sub-pixel Sub4 on the basis of the extracted pixel data Rp, Gp, and Bp and the extracted block data Rb, Gb, and Bb.

When the backlight unit BLU driven in the color dimming mode provides the light to the pixel PX including the red, green, blue, and white sub-pixels Sub1, Sub2, Sub3, and Sub4, the color reproducibility of each pixel PX may be lowered. This is because the white sub-pixel Sub4 does not include the color filter and the light provided to the white sub-pixel Sub4 from the backlight unit BLU is not sharpened. That is, a full-width-half-maximum (FWHM) of the light becomes wider and the light provided to the white sub-pixel Sub4 exerts influence on the red, green, and blue sub-pixels Sub1, Sub2, and Sub3.

Accordingly, when the pixel data Rp, Gp, and Bp are compared to the block data Rb, Gb, and Bb and the grayscale of the white sub-pixel Sub4 is controlled to be lowered, which exerts influence on the color reproducibility as a difference between the pixel data Rp, Gp, and Bp are compared to the block data Rb, Gb, and Bb becomes greater, the color reproducibility of the pixel PX may be prevented from being deteriorated.

An algorithm in which the color compensator 60 generates the white compensation data W' will be described in detail with reference to FIGS. 2 to 4. The color compensator 60 applies the pixel data Rp, Gp, and Bp and the white compensation data W' to the data processor 50 and applies the block data Rb, Gb, and Bb to the backlight driver 70.

The data processor 50 receives the pixel data Rp, Gp, and Bp and the white compensation data W'. The data processor 50 processes the pixel data Rp, Gp, and Bp to correspond to layouts of the red, green, blue, and white sub-pixels Sub1, Sub2, Sub3, and Sub4 and generates the compensated pixel data Rp', Gp', and Bp'. The compensated pixel data Rp', Gp', and Bp' include compensated red pixel data Rp', compensated green pixel data Gp', and compensated blue pixel data Bp'. The data processor 50 applies the compensated pixel data Rp', Gp', and Bp' and the white compensation data W' to the timing controller 10.

FIG. 1 shows the block diagram of the display apparatus 1 according to an exemplary embodiment and the blocks separated from each other are determined depending on functions of elements included in the display apparatus 1. Therefore, the above-mentioned elements may be embodied in one or more chips and realized by one or more hardware devices. In addition, the above-mentioned elements may share the same hardware device to carry out their functions.

Figure 2:
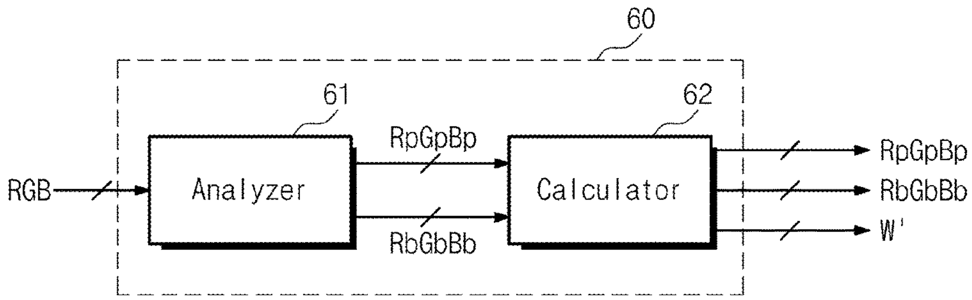
FIG. 2 is a block diagram showing a color compensator shown in FIG. 1.

FIG. 2 is a block diagram showing the color compensator 60 shown in FIG. 1. FIG. 3 is a perspective view showing the display panel 40 and the backlight unit BLU providing the light to the display panel 40 according to an exemplary embodiment of the present disclosure. FIG. 4 is a flowchart showing a data processing method of the color compensator 60 according to an exemplary embodiment of the present disclosure.

Referring to FIG. 2, the color compensator 60 includes an analyzer 61 and a calculator 62.

The analyzer 61 receives the image data R, G, and B in the unit of frame. The analyzer 61 analyzes the image data R, G, and B and extracts the pixel data Rp, Gp, and Bp and the block data Rb, Gb, and Bb corresponding to the pixel data Rp, Gp, and Bp.

Figure 3:
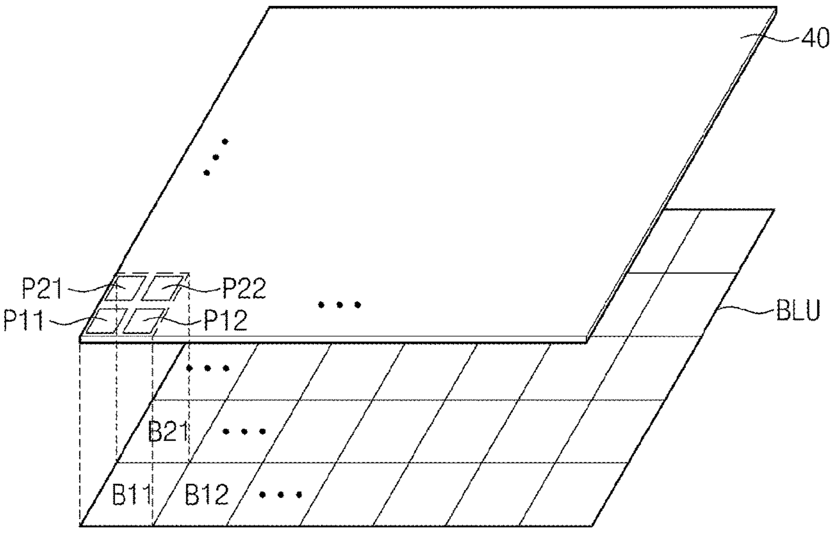
FIG. 3 is a perspective view showing a display panel and a backlight unit providing a light to the display panel according to an exemplary embodiment of the present disclosure.

Referring to FIG. 3, the blocks BL of the backlight unit BLU and the pixels PX have a correspondence relation of 1:n (where n is a rational number greater than 0). That is, one block B11 corresponds to plural pixels P11, P12, P21, and P22 and the one block B11 provides the light to the corresponding pixels P11, P12, P21, and P22. The analyzer 61 analyzes the image data R, G, and B and extracts the pixel data Rp, Gp, and Bp and the block data Rb, Gb, and Bb of the pixel P11 and the block B11, which correspond to each other. For instance, when the first block B11 provides the light to the first pixel P11, the block data Rb, Gb, and Bb about the first block B11 and the pixel data Rp, Gp, and Bp about the first pixel P11 are extracted.

The pixel data Rp, Gp, and Bp includes red pixel data Rp, green pixel data Gp, and blue pixel data Bp respectively corresponding to the red, green, and blue sub-pixels Sub1, Sub2, and Sub3. The red pixel data Rp are data related to a grayscale of the red sub-pixel Sub1, the green pixel data Gp are data related to a grayscale of the green sub-pixel Sub2, and the blue pixel data Bp are data related to a grayscale of the blue sub-pixel Sub3.

The block data Rb, Gb, and Bb includes red block data Rb, green block data Gb, and blue block data Bb respectively corresponding to red, green, and blue light sources. The red block data Rb are data related to a dimming level of the red light source, the green block data Gb are data related to a dimming level of the green light source, and the blue block data Bb are data related to a dimming level of the green light source.

Referring to FIG. 2 again, the analyzer 61 applies the extracted block data Rb, Gb, and Bb and the extracted pixel data Rp, Gp, and Bp to the calculator 62. The calculator 62 generates the white compensation data W' corresponding to the white sub-pixel Sub4 using the block data Rb, Gb, and Bb and the pixel data Rp, Gp, and Bp.

Figure 4:
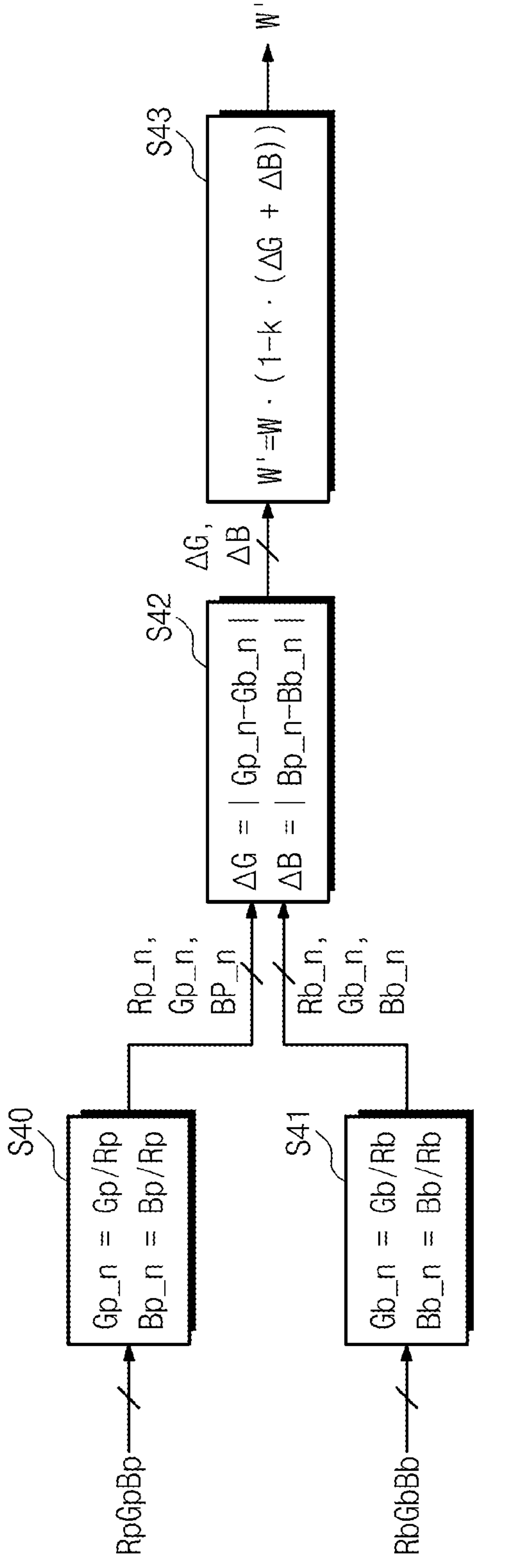
FIG. 4 is a flowchart showing a data processing method of a color compensator according to an exemplary embodiment of the present disclosure.

Referring to FIG. 4, the calculator 62 normalizes the pixel data Rp, Gp, and Bp and the block data Rb, Gb, and Bb provided from the analyzer 61 to generate the white compensation data W'.

The calculator 62 selects one of the red, green, and blue pixel data Rp, Gp, and Bp included in the pixel data Rp, Gp, and Bp as reference pixel data and normalizes the other pixel data using the reference pixel data.

For instance, the calculator 62 may select the red pixel data Rp included in the pixel data Rp, Gp, and Bp as the reference pixel data. In this case, the calculator 62 normalizes the green and blue pixel data Gp and Bp using the red pixel data Rp (S40). The calculator 62 performs a calculation on the green and blue pixel data Gp and Bp to divide the green and blue pixel data Gp and Bp by the red pixel data Rp, and thus the green and blue pixel data Gp and Bp are normalized using the red pixel data Rp.

The calculator 62 normalizes the other pixel data and generates first and second normalized pixel data. The first normalized pixel data corresponds to the normalized green pixel data Gp_n normalized with reference to the red pixel data Rp and the second normalized pixel data corresponds to the normalized blue pixel data Bp_n normalized with reference to the red pixel data Rp.

The calculator 62 selects one of the red, green, and blue block data Rb, Gb, and Bb included in the block data Rb, Gb, and Bb as reference block data and normalizes the other block data using the reference block data.

For instance, the calculator 62 may select the red block data Rb included in the block data Rb, Gb, and Bb as the reference block data. In this case, the calculator 62 normalizes the green and blue block data Gb and Bb using the red block data Rb in step (S41). The calculator 62 performs a calculation on the green and blue block data Gb and Bb to divide the green and blue block data Gb and Bb by the red block data Rb, and thus the green and blue block data Gb and Bb are normalized using the red block data Rb.

The calculator 62 normalizes the other block data and generates first and second normalized block data. The first normalized block data corresponds to the normalized green block data Gb_n normalized with reference to the red block data Rb and the second normalized block data corresponds to the normalized blue block data Bb_n normalized with reference to the red block data Rb.

The reference pixel data and the reference block data may have the same color properties. For instance, when the red pixel data Rp are selected as the reference pixel data, the reference block data may be the red block data Rb. In this case, the first normalized pixel data and the first normalized block data have the same color properties and the second normalized pixel data and the second normalized block data have the same color properties.

Then, the calculator 62 compares the normalized pixel data to the normalized block data. In more detail, the calculator 62 compares the first normalized pixel data with the first normalized block data and compares the second normalized pixel data with the second normalized block data. The calculator 62 generates first intermediate data related to a difference between the first normalized pixel data and the first normalized block data and second intermediate data related to a difference between the first normalized pixel data and the first normalized block data.

For instance, the calculator 62 calculates the green pixel data Gp_n normalized with reference to the red pixel data Rp and the green block data Gb_n normalized with reference to the red block data Rb to generate the first intermediate data ΔG related to the difference between the two data (S42). In addition, the calculator 62 calculates the blue pixel data Bp_n normalized with reference to the red pixel data Rp and the blue block data Bb_n normalized with reference to the red block data Rb to generate the second intermediate data ΔB related to the difference between the two data in step (S42).

Then, the calculator 62 generates the white compensation data W' using the first and second intermediate data and the white pixel data W previously stored. The previously stored white pixel data W are data about a maximum grayscale of the white sub-pixel Sub4 and previously stored in a memory provided in the calculator 62.

The calculator 62 generates the white compensation data W' decreasing in size compared to that of the previously stored white pixel data W as the first and second intermediate data becomes greater.

As an example, the calculator 62 applies the first and second intermediate data and the previously stored white pixel data W to the following equation to generate the white compensation data W'.

$$W' = W \cdot \{1 - [K \cdot (\Delta X + \Delta Y)]\} \quad \text{Equation}$$

In the equation, W' denotes the white compensation data, W denotes the previously white pixel data, ΔX denotes the first intermediate data, ΔY denotes the second intermediate data, and K denotes a color control constant. Here, K is increases at the high brightness area in which a color difference is easily perceived and decreases at the low brightness area in which the color difference is difficult to be perceived.

As shown in FIG. 4, when the first intermediate data ΔG corresponds to the difference between the normalized green pixel data Gp_n and the normalized green block data Gb_n and the second intermediate data ΔB corresponds to the normalized blue pixel data Bp_n and the normalized blue block data Bb_n, the above equation may be expressed as $W' = W \cdot \{1 - [K \cdot (\Delta G + \Delta B)]\}$ in step (S43).

Referring to FIG. 1 again, the color compensator 60 applies the pixel data Rp, Gp, and Bp generated by the analyzer 61 and the white compensation data W' generated by the calculator 62 to the data processor 50. In addition, the color compensator 60 applies the block data Rb, Gb, and Bb generated by the analyzer 61 to the backlight driver 70.

The data processor 50 receives the pixel data Rp, Gp, and Bp and the white compensation data W'. The data processor 50 processes the pixel data Rp, Gp, and Bp to correspond to the layouts of the red, green, blue, and white sub-pixels Sub1, Sub2, Sub3, and Sub4 and generates the compensated pixel data Rp', Gp', and Bp'. For instance, the data processor 50 performs a rendering process on the pixel data Rp, Gp, and Bp to generate the compensated pixel data Rp', Gp', and Bp'.

The compensated pixel data Rp', Gp', and Bp' include the compensated red pixel data Rp', the compensated green pixel data Gp', and the compensated blue pixel data Bp'. The data processor 50 applies the compensated pixel data Rp', Gp', and Bp' and the white compensation data W' to the timing controller 10.

The backlight driver 70 receives the block data Rb, Gb, Bb about the dimming level of each light source in each block BL and generates the PWMS on the basis of the block data Rb, Gb, and Bb. The backlight driver 70 applies the PWMS to the backlight unit BLU to drive the backlight unit BLU in the color dimming mode.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of controlling a display apparatus comprising a display panel and a backlight unit, the display panel comprising a plurality of pixels, each pixel of the plurality of pixels comprising red, green, blue, and white sub-pixels, comprising:

receiving image data in a unit of a frame;

extracting pixel data from the image data to drive a first pixel among the pixels of the display panel, the pixel data comprising red, green and blue sub-pixel data, which respectively correspond to the red, green, and blue sub-pixels;

extracting block data from the image data to drive a first block among a plurality of blocks of the backlight unit, the first block covering the first pixel, and the block data comprising red, green and blue sub-block data;

selecting one of sub-pixel data as a reference pixel data among the red, green and blue sub-pixel data;

dividing rest of the sub-pixel data by the reference pixel data to normalize the rest of the sub-pixel data;

selecting one of the sub-block data as a reference block data among the red, green and blue sub-block data;

dividing rest of the sub-block data by the reference block data to normalize the rest of the sub-block data;

comparing the normalized sub-pixel data and the normalized sub-block data and generating a compared result;

generating an intermediate data by obtaining a difference between a normalized sub-pixel data and a normalized sub-block data; and generating white compensation data corresponding to the white sub-pixel from the intermediate data.

2. The method of claim 1, wherein the first block comprises a red light source having a red light color, a green light source having a green light color, and a blue light source having a blue light color.

3. The method of claim 2, wherein a red light emitted from the red light source has a wavelength of about 580 nm to about 700 nm, a green light emitted from the green light source has a wavelength of about 460 nm to about 630 nm, and a blue light emitted from the blue light source has a wavelength of about 400 nm to about 520 nm.

4. The method of claim 2, wherein the red, green and blue sub-block data respectively correspond to the red, green, and blue light sources.

5. The method of claim 4, wherein the red sub-block data are about a dimming level of the red light source, the green sub-block data are about a dimming level of the green light source, and the blue sub-block data are about a dimming level of the blue light source.

6. The method of claim 5, wherein said selecting the reference pixel data comprises selecting the red sub-pixel data as the reference pixel data; and said dividing the rest of the sub-pixel data comprises:

dividing the green sub-pixel data by the red sub-pixel data to generate first normalized pixel data; and dividing the blue sub-pixel data by the red sub-pixel data to generate second normalized pixel data.

7. The method of claim 6, wherein said selecting a reference block data comprises selecting one of the red, green, and blue sub-block data as reference block data; and said normalizing the rest of the sub-block data comprises generating first and second normalized sub-block data.

8. The method of claim 7, wherein the comparing of the normalized sub-pixel data and the normalized sub-block data comprises:

comparing the first normalized pixel data and the first normalized sub-block data; and comparing the second normalized pixel data and the second normalized sub-block data.

9. The method of claim 8, wherein the first normalized sub-pixel data and the first normalized sub-block data have same color properties and the second normalized sub-pixel data and the second normalized sub-block data have same color properties.

10. The method of claim 9, wherein the comparing of the first and second normalized sub-pixel data to the first and second normalized sub-block data, respectively, comprises:

calculating the first normalized sub-pixel data and the first normalized sub-block data to generate first intermediate data corresponding to a difference between the first normalized sub-pixel data and the first normalized sub-block data; and calculating the second normalized sub-pixel data and the second normalized sub-block data to generate second intermediate data corresponding to a difference between the second normalized sub-pixel data and the second normalized sub-block data.

11. The method of claim 10, wherein the white compensation data are generated by using the first intermediate data, the second intermediate data, and a previously stored white pixel data.

12. The method of claim 11, wherein the previously stored white sub-pixel data are data about a maximum grayscale of the white sub-pixel.

13. The method of claim 12, wherein the white compensation data are decreased as the first and second intermediate data becomes greater.

14. The method of claim 13, wherein the generating of the white compensation data comprises applying the first intermediate data, the second intermediate data, and the previously stored white sub-pixel data to the following equation of $W'=W\cdot\{1-[K\cdot(\Delta X+\Delta Y)]\}$ to generate the white compensation data, where $W'$ denotes the white compensation data, $W$ denotes the previously white sub-pixel data, $\Delta X$ denotes the first intermediate data, $\Delta Y$ denotes the second intermediate data, and $K$ denotes a color control constant.

15. The method of claim 13, further comprising processing the pixel data to correspond to layouts of the sub-pixels included in each of the pixels and to generate compensated pixel data.

16. The method of claim 15, further comprising driving each of the pixels on the basis of the compensated pixel data and the white compensation data.

17. The method of claim 16, further comprising generating an input pulse width modulation signal using the block data; and driving the first block in a color dimming mode using the pulse width modulation signal.

18. A display apparatus comprising:

a display panel comprising a plurality of pixels each comprising red, green, blue, and white sub-pixels;

a backlight unit comprising a plurality of blocks each being driven in a color dimming mode; and a color compensator compensating a color of a light exiting through each of the pixels, wherein the color compensator performs operations comprising:

receiving image data in a unit of frame;

extracting pixel data from the image data to drive a first pixel among the pixels of the display panel, the pixel data comprising red, green and blue sub-pixel data, which respectively correspond to the red, green, and blue sub-pixels;

extracting block data from the image data to drive a first block among a plurality of blocks of the backlight unit, the first block covering the first pixel and the block data comprising red, green and blue sub-block data;

selecting one of the sub-pixel data as a reference pixel data among the red, green and blue sub-pixel;

dividing the rest of the sub-pixel data by the reference pixel data to normalize the rest of the sub-pixel data;

selecting one of the sub-block data as a reference block data among the red, green and blue sub-block data;

dividing the rest of the sub-block data by the reference block data to normalize the rest of the sub-block data;

comparing the normalized pixel data and the normalized sub-block data and generating a compared result;

generating an intermediate data by obtaining a difference between a normalized sub-pixel data and a normalized sub-block data; and generating white compensation data corresponding to the white sub-pixel from the intermediate data.

19. The display apparatus of claim 18, wherein:

the first block comprises a red light source having a red light color, a green light source having a green light color, and a blue light source having a blue light color, the red, green and blue sub-block data respectively correspond to the red, green, and blue light sources, the red sub-block data are about a dimming level of the red light source, the green block data are about a dimming level of the green light source, and the blue block data are about a dimming level of the blue light source.

* * * * *